(12) United States Patent
McMorrow (10) Patent No.: US 7,705,674 B2
(45) Date of Patent: Apr. 27, 2010

(54) AMPLIFIER DRIVER

(75) Inventor: Robert J. McMorrow, Concord, MA (US)

(73) Assignee: Star RF, Inc., Waltham, MA (US)

( * ) Notice: Subject to any disclaimer, the term of this patent is extended or adjusted under 35 U.S.C. 154(b) by 0 days.

(21) Appl. No.: 11/985,371

(22) Filed: Nov. 15, 2007

(65) Prior Publication Data
US 2008/0116972 A1 May 22, 2008

Related U.S. Application Data

(60) Provisional application No. 60/866,147, filed on Nov. 16, 2006, provisional application No. 60/866,139, filed on Nov. 16, 2006, provisional application No. 60/866,144, filed on Nov. 16, 2006.

(51) Int. Cl.
*H03F 3/18* (2006.01)

(52) U.S. Cl. .................. 330/251; 330/264; 330/207 A (58) Field of Classification Search ............... 330/251, 330/10, 207 A, 302, 307, 284, 298, 341; 333/81 R
See application file for complete search history.

(56) References Cited

U.S. PATENT DOCUMENTS

| | | |
|---|---|---|
| 3,668,545 A | 6/1972 | Von Recklinghausen |
| 3,757,220 A | 9/1973 | Abel |
| 3,950,691 A | 4/1976 | Ohba |
| 4,092,610 A | 5/1978 | White et al. |
| 4,115,740 A | 9/1978 | Yoshida et al. |
| 5,023,566 A | 6/1991 | El-Hamamsy et al. |
| 5,115,203 A | 5/1992 | Krett et al. |
| 5,115,205 A | 5/1992 | Holmes, Jr. |
| 5,200,711 A | 4/1993 | Andersson et al. |
| 5,306,986 A | 4/1994 | Siao |
| 5,396,194 A | 3/1995 | Williamson et al. |
| 5,479,337 A | 12/1995 | Voigt |

(Continued)

FOREIGN PATENT DOCUMENTS

| | | |
|---|---|---|
| WO | WO 03/041249 | 5/2003 |
| WO | WO 2005/025065 | 3/2005 |

OTHER PUBLICATIONS

A. Alipov and V. Kozyrev, "Push/Pull Class-DE Switching Power Amplifier", 2002 IEEE MTT-S International Microwave Symposium Digest, (IMS 2002), Seattle, WA, Jun. 2-7, 2002, IEEE MTT-S International Microwave Symposium, New York, NY, IEEE, US, Jun. 2, 2002, pp. 1635-1638, vol. 3 of 3.

(Continued)

*Primary Examiner*—Robert Pascal
*Assistant Examiner*—Hieu P Nguyen
(74) *Attorney, Agent, or Firm*—Wolf, Greenfield & Sacks, P.C.

(57) ABSTRACT

Exemplary techniques for implementing an amplifier suitable for RF amplification, such as a tuned class DE amplifier, are disclosed. One disclosed embodiment of a circuit for amplifying an RF signal includes a push-pull amplifier comprising a push transistor and a pull transistor. A first driver amplifier drives the push transistor of the push-pull amplifier with a first RF signal. A second driver amplifier drives the pull transistor of the push-pull amplifier with a second RF signal different from the first RF signal.

22 Claims, 12 Drawing Sheets

U.S. PATENT DOCUMENTS

| | | | |
|---|---|---|---|
| 5,483,197 | A | 1/1996 | Nishioka et al. |
| 5,546,048 | A | 8/1996 | Sano et al. |
| 5,612,647 | A | 3/1997 | Malec |
| 5,729,175 | A | 3/1998 | Ferrer |
| 5,963,086 | A | 10/1999 | Hall |
| 6,014,055 | A | 1/2000 | Chester |
| 6,127,885 | A | 10/2000 | Colangelo |
| 6,304,137 | B1 | 10/2001 | Pullen et al. |
| 6,404,823 | B1 | 6/2002 | Grange et al. |
| 6,441,673 | B1 | 8/2002 | Zhang |
| 6,459,336 | B1 | 10/2002 | Luu |
| 6,462,620 | B1 | 10/2002 | Dupuis et al. |
| 6,687,380 | B1 | 2/2004 | Vishwamitra |
| 6,701,138 | B2 | 3/2004 | Epperson et al. |
| 6,754,287 | B2 | 6/2004 | Underbrink et al. |
| 6,757,129 | B2 | 6/2004 | Kuroiwa et al. |
| 6,763,114 | B1 | 7/2004 | Nalbant |
| 6,765,442 | B2 | 7/2004 | Kane |
| 6,831,423 | B2 | 12/2004 | Chen |
| 6,856,199 | B2 | 2/2005 | Komijani et al. |
| 6,914,480 | B2 | 7/2005 | Arai et al. |
| 7,239,185 | B2 * | 7/2007 | Koch et al. ............ 327/112 |
| 7,479,829 | B2 * | 1/2009 | Inoue ............ 330/251 |
| 2003/0058039 | A1 | 3/2003 | Noro |
| 2004/0004517 | A1 | 1/2004 | Ruha et al. |
| 2004/0037363 | A1 | 2/2004 | Norsworthy et al. |
| 2004/0041545 | A1 | 3/2004 | Garabandic |
| 2004/0108900 | A1 | 6/2004 | Apel |
| 2004/0124915 | A1 | 7/2004 | Heubi et al. |
| 2004/0140848 | A1 | 7/2004 | Bayko |
| 2005/0218988 | A1 | 10/2005 | Berkhout |
| 2006/0001332 | A1 | 1/2006 | Ollila |
| 2006/0006934 | A1 | 1/2006 | Burns et al. |
| 2006/0006937 | A1 | 1/2006 | Burns et al. |
| 2006/0006939 | A1 | 1/2006 | Burns et al. |
| 2006/0170043 | A1 | 8/2006 | Liu et al. |
| 2007/0040471 | A1 | 2/2007 | Ollila |

OTHER PUBLICATIONS

S. Hintea, E. Simion and L. Festila, "Radio Frequency Link Used in Partially-Implanted Auditory Prosthesis", Electronics, Circuits and Systems, 1996, ICECS '96, Proceedings of the Third IEEE International Conference on Rodos, Greece, Oct. 13-16, 1996, New York, NY, USA, IEEE, US, pp. 1143-1146, vol. 2.

International Search Report and Written Opinion for International application No. PCT/US2007/023979 mailed May 8, 2008.

International Search Report and Written Opinion for International application No. PCT/US2007/023971 mailed Aug. 4, 2008.

* cited by examiner

AMPLIFIER DRIVER

RELATED APPLICATIONS

This application claims priority under 35 U.S.C. §119(e) to U.S. Provisional Application Ser. No. 60/866,147, entitled "Electronic Switch Network," filed on Nov. 16, 2006; U.S. Provisional Application Ser. No. 60/866,144, entitled "Distributed Multi-Stage Amplifier," filed on Nov. 16, 2006; and U.S. Provisional Application Ser. No. 60/866,139, entitled "Pulse Amplifier," filed on Nov. 16, 2006. Each of the foregoing applications is hereby incorporated by reference herein in its entirety.

BACKGROUND OF INVENTION

1. Field of Invention

This invention generally pertains to methods and devices for amplifying a signal. In certain aspects, it relates to power amplifiers and amplifier systems working at radio frequencies (RF) or higher. Applications include, but are not limited to, wireless systems, microwave components, power amplifiers, CMOS amplifiers, driver amplifiers, and portable electronics.

2. Discussion of Related Art

A common problem in power amplifier (PA) design is dealing with the breakdown limitations of the device technology. Most techniques for power amplification produce a peak voltage on the terminals of the device between two and four times the supply voltage. It is often desirable to tune the amplifier to create a peak voltage as high as possible to improve the efficiency of the amplifier. However, this peak voltage must stay well below the breakdown limits of the device technology. This creates a problem for technologies such as CMOS which have very low breakdown voltages. For example, in a wireless handset the supply voltage can be nominally 3.5V and the peak voltage for an efficient amplifier can be at least 7.0V. A 0.5 um CMOS process typically only has a breakdown voltage of 5.0V, making the technology unsuitable for the application.

A second problem can arise when a power amplifier is used to drive an antenna or other uncontrolled load impedance. In the case of an antenna, the PA might see a load impedance that varies by a factor of as much as ten. This can cause the PA to deviate from its nominal class of operation and produce peak voltages significantly higher than planned. For this reason, it may be desirable to use a device technology with a breakdown voltage of greater than four to five times the supply voltage.

Several techniques have been employed in the industry to avoid these problems. Multiple cascade stages have been used to reduce the voltage across any one transistor. Amplifiers can also be implemented in series with the supply to divide the voltage swing across two or more sets of transistors. Either of these techniques can solve the first problem but will struggle with the second issue of load tolerance. A DC-DC converter can also be used to control the supply voltage. However, this will have a significant impact on the cost of the system and may also struggle with the second problem.

Push-pull class D amplifiers have the advantage of keeping the voltage at or below the supply voltage for all conditions. While this solves the two major problems discussed, they have poor DC to RF conversion efficiency at RF frequencies. This is because the output capacitance of the two devices must be discharged each time the amplifier switches state. The resulting power loss is $2 \cdot \pi \cdot F \cdot C_{out} \cdot (V_{SW})^2$, where F is the switching frequency, $C_{out}$ is the output capacitance and $V_{SW}$ is the voltage across a switch upon switching. This power loss is proportional to the switching frequency, F, and is unacceptably high at RF for most commercially available device technologies.

Figure 1A:
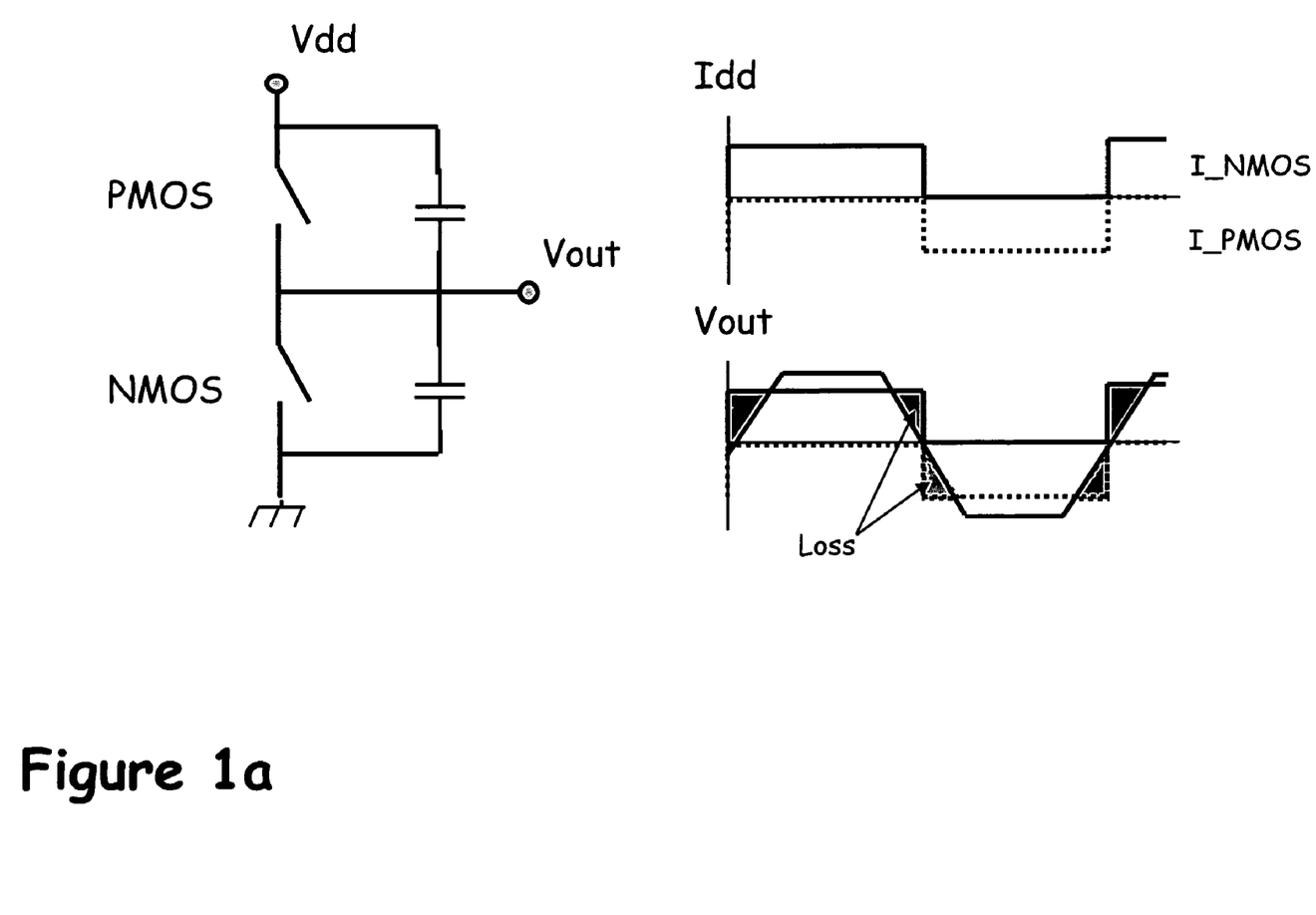
FIG. 1a shows a push-pull amplifier power stage having switching power losses.

One variant of this technique that retains the advantage of low peak voltages while producing high efficiency is the class DE amplifier. This was first suggested by Zhukov and Kozyrev in 1975. Its most widespread use has been for rectifiers for DC converters. The basic idea is to improve the efficiency of a class D push-pull amplifier by controlling the switching duty of the two devices. Typically, the biggest source of power loss in a push-pull amplifier at RF is the energy that is dissipated while charging the output capacitance of the devices during transitions. FIG. 1a shows a push-pull amplifier with the devices drawn as ideal switches with parasitic output capacitance. As the bottom switch transitions from the off state to the on state, it must discharge the full supply voltage present at its drain. Since these losses can be incurred in each cycle, the overall power dissipation caused by the bottom switch is $0.5 \cdot \omega \cdot C_n \cdot (Vsup)^2$ (where $\omega = 2 \cdot \pi \cdot F$, $C_n$ is the parasitic output capacitance of the bottom switch, and Vsup is the supply voltage). A similar loss of $0.5 \cdot \omega \cdot C_P \cdot (Vsup)^2$ is incurred during the transition of the top switch. The total power loss incurred by both switches is thus represented by $\omega \cdot (C_n + C_p) V^2 = \omega \cdot C_{out} \cdot (Vsup)^2$. At RF frequencies this can be a significant loss in power and efficiency. The class DE amplifier can overcome this problem by switching the devices with independent signals and creating a period of time where both transistors are simultaneously off. A tuned output network can be used to provide the current necessary to discharge the output capacitance before the switch turns on. The class E condition of zero-voltage with zero-slope switching can be imposed to realize high efficiency. Efficiencies can be obtained that rival or surpass the techniques previously discussed while maintaining a peak voltage that is no greater than the supply voltage. Moreover, this circuit can be designed such that the peak voltage will never be higher than the supply, even under VSWR (Voltage Standing Wave Ratio) mismatch conditions. The penalties for this advantage can include a lower power density (a by-product of the lower peak voltage) and a more complex input drive. The low gain of most devices at RF and the complexity of the system have made realizing a class DE amplifier impractical at RF frequencies.

SUMMARY OF INVENTION

Exemplary techniques for implementing an amplifier suitable for RF amplification, such as a tuned class DE amplifier, are disclosed. Such techniques can overcome the voltage limitations inherent in many device technologies (including CMOS) while retaining high DC to RF power conversion efficiency.

In accordance with embodiments of the present invention, a circuit for amplifying a signal is disclosed. In some embodiments, such a circuit can have a distributed architecture that includes one or more amplifier stages, each of which can include one or more push-pull amplifiers. Each stage can drive a following stage, and the last stage may provide a filtered output for the amplifier. A pulse width modulating circuit or other circuit can be connected to the first amplifier stage to generate input signals. Such input signals can be in the form of input pulses selected such that a desired output waveform for the circuit is achieved.

In some embodiments, such a circuit can simplify the circuitry required to realize class DE operation. The circuit may use highly efficient amplifiers for one or more stages of the circuit that are designed to produce significant amounts of power. The high efficiency of these stages can overcome previous limitations caused by the low gain of power transistors at RF frequencies. These techniques can provide a multistage class DE amplifier with high gain and high efficiency. Furthermore, the drive circuitry used to provide input waveforms to the multistage amplifier may only drive low power levels, such that the drive circuitry can be realized using low power circuit techniques.

One embodiment relates to a circuit for amplifying an RF signal. The circuit includes a push-pull amplifier comprising a push transistor and a pull transistor. A first driver amplifier drives the push transistor of the push-pull amplifier with a first RF signal. A second driver amplifier drives the pull transistor of the push-pull amplifier with a second RF signal different from the first RF signal.

Another embodiment relates to a driver stage for driving a push-pull amplifier to amplify an RF signal. The push-pull amplifier includes a push transistor and a pull transistor. The driver stage includes first and second driver amplifiers. The first driver amplifier drives the pull transistor of the push-pull amplifier with a first RF signal. The second driver amplifier drives the push transistor of the push-pull amplifier with a second RF signal different from the first RF signal.

Yet another embodiment relates to a circuit for amplifying a signal. A push-pull amplifier includes a push transistor and a pull transistor. A first class D amplifier drives the push transistor of the push-pull amplifier with a first signal. A second class D amplifier drives the pull transistor of the push-pull amplifier with a second signal different from the first signal.

A further embodiment relates to a method of driving a push-pull amplifier. The push-pull amplifier includes a push transistor and a pull transistor. The push transistor is driven with a first pulsed RF signal. The pull transistor is driven with a second pulsed RF signal different from the first pulsed RF signal.

BRIEF DESCRIPTION OF DRAWINGS

In the drawings, each identical or nearly identical component that is illustrated in various figures is represented by a like numeral. These drawings are not necessarily drawn to scale. For purposes of clarity, not every component may be shown or labeled in every drawing. In the drawings.

DETAILED DESCRIPTION

Figure 1B:
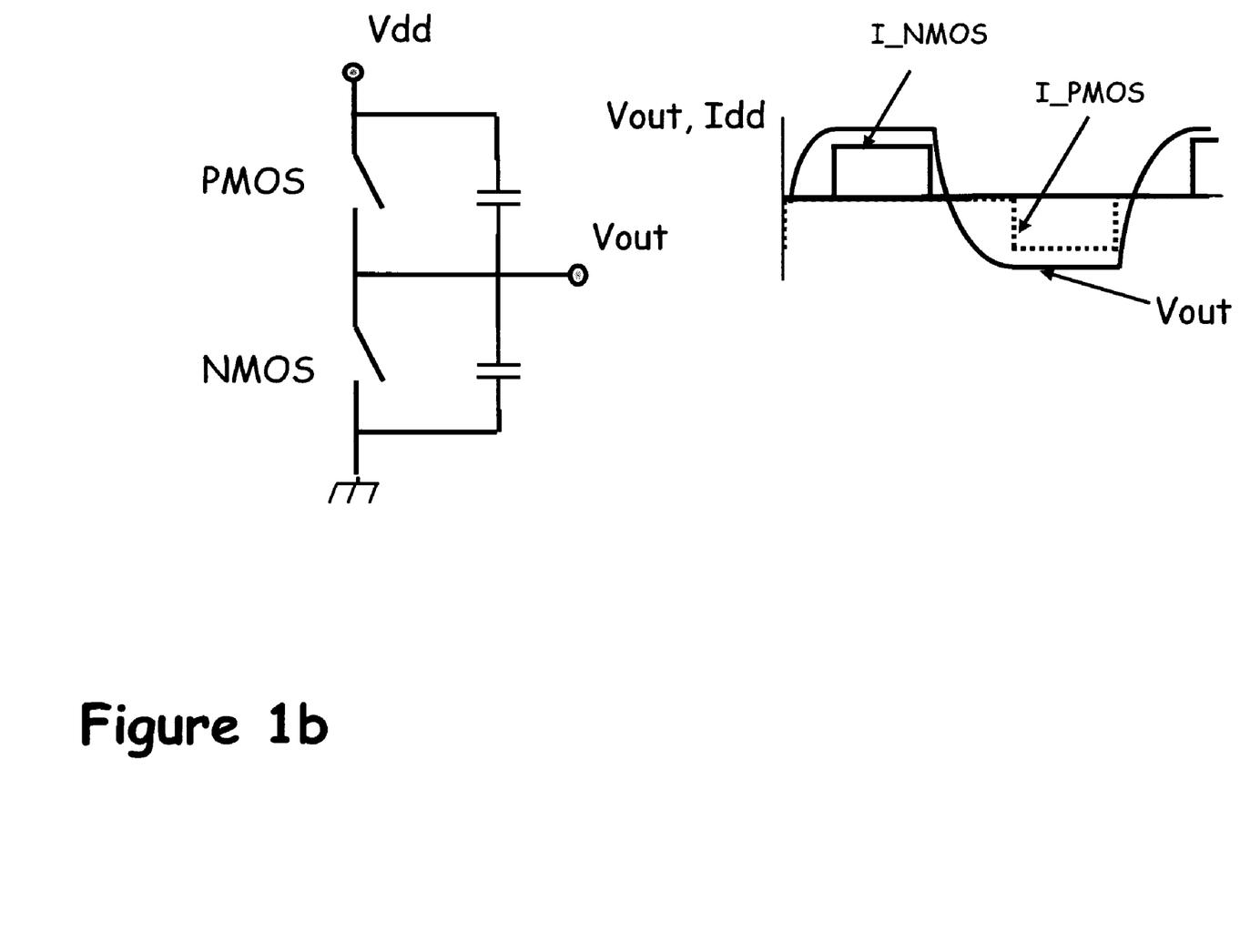
FIG. 1b shows a common amplifier stage.

One attempt at overcoming the above-described limitations is illustrated in FIG. 1b, which shows a common amplifier stage in which high efficiency is achieved by turning each of devices 101 and 102 off prior to turning the other device on. This creates a period of time where both devices are off allowing the voltage at the common node to fully discharge before current flows in the devices. The waveforms 103 and 104 show the period of time when each device is in the on state. At all other times the device is turned off. The waveform 105 shows the voltage at the common terminal.

Figure 1C:
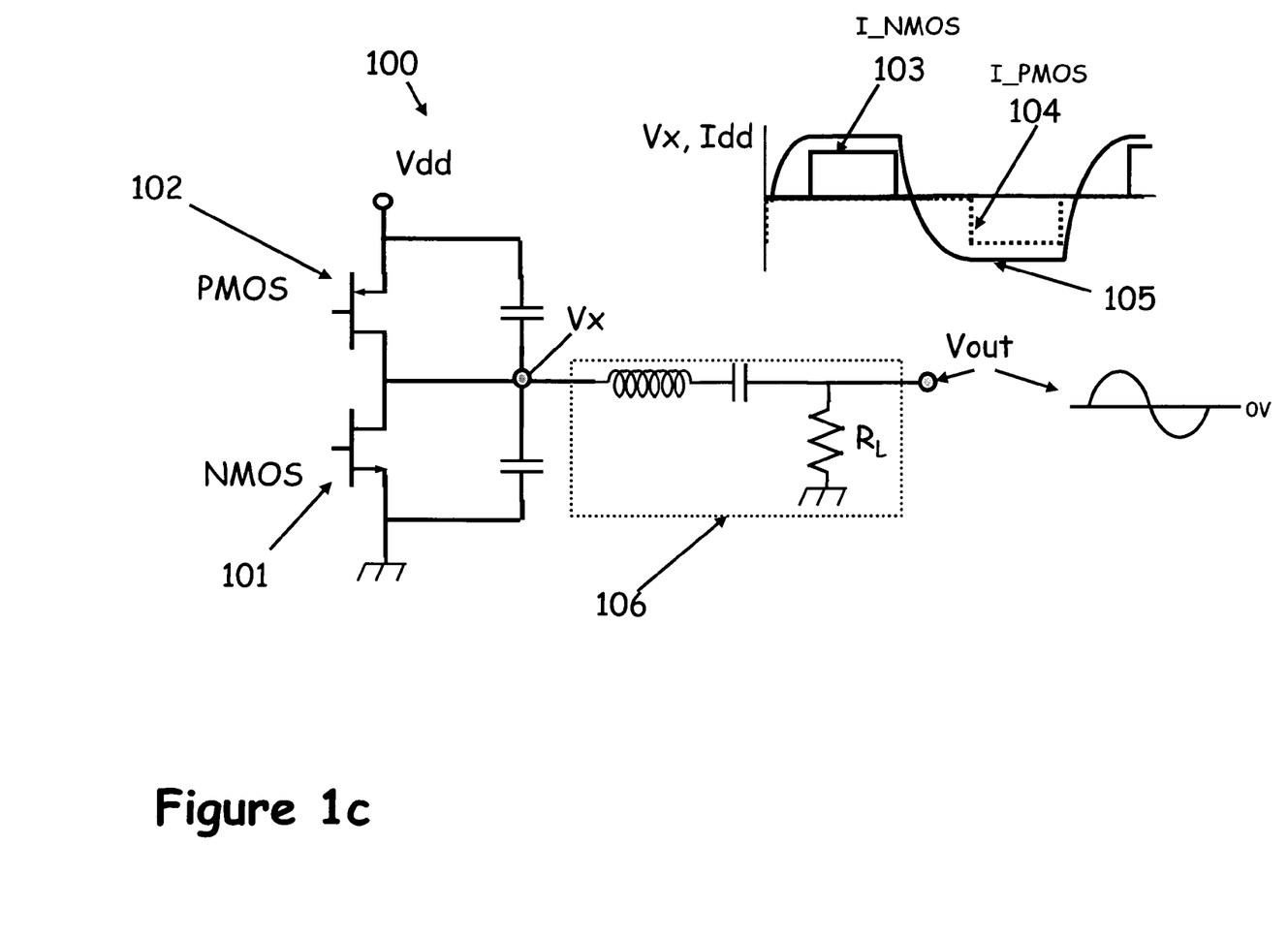
FIG. 1c shows another common RF amplifier stage.

Exemplary operation of a class DE stage is depicted in FIG. 1c, which shows circuit 100. As shown, transistors 101 and 102 are configured to operate similar to a push-pull amplifier. Higher DC to RF conversion efficiency than a standard push-pull class D amplifier is achieved, however, by turning off each stage prior to turning the other stage on. This creates a period of time where both devices are off, allowing the voltage at the common node to fully discharge before current flows in the devices. The waveforms 103 and 104 represent the current through transistors 101 and 102. At all other times the device is turned off. The waveform 105 shows the voltage at the common terminal Vx. The tuned load network 106 can be designed such that each transistor turns on with zero current and voltage across its terminals. Each transistor can be operated with non-overlapping duty cycles of less than 50% and with precise control of the timing to achieve class DE operation. This may be achieved by driving each transistor with digitally generated pulse width modulated signals. However, this is not practical at RF frequencies with the power levels necessary to drive an output stage. The class DE amplifier is also usually only practical if the efficiency of the driver stage does not degrade the overall amplifier efficiency.

Figure 2:
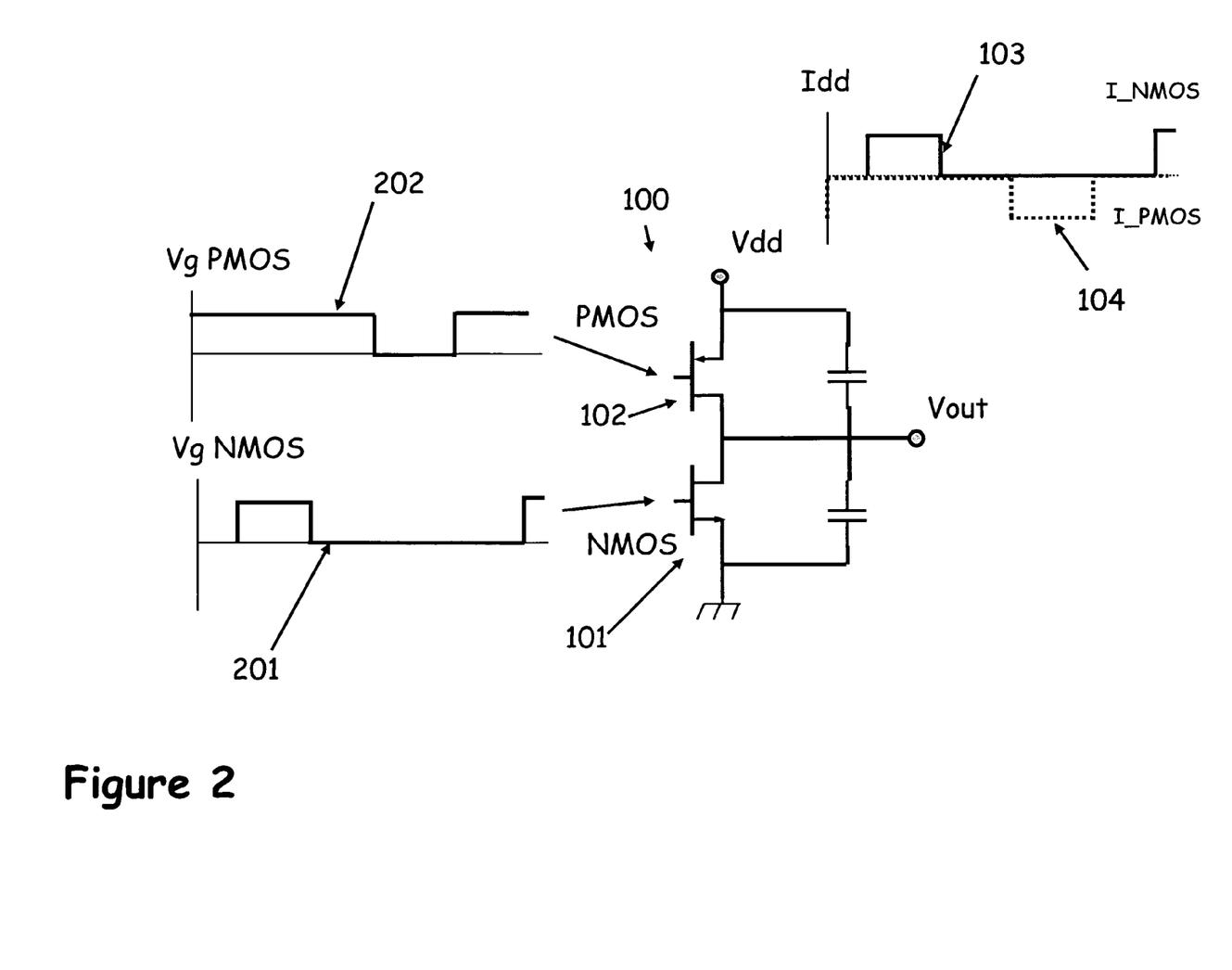
FIG. 2 shows drive signals for driving a class DE amplifier power stage.

FIG. 2 shows drive signals 201 and 202 used to achieve the current waveforms 103, 104 in FIGS. 1a-1c. Transistor 101 is an NMOS transistor, transistor 102 is a PMOS transistor, and the drive waveforms 201 and 202 illustrate the drive signals provided to transistors 101 and 102. Drive waveforms 201 and 202 may be generated and provided to drive transistors 101 and 102 in accordance with class DE amplification. The large input capacitance associated with the devices and the high frequency of operation mean that a large amount of power will usually also be required. In practice, a gain of only about 8 dB can be expected from the output stage transistors at 1 GHz. If the amplifier is required to deliver 1 Watt of output power then the driver stage typically must supply a drive power of 158 mW, about one sixth of the total. This means that if the driver stage is not operating at high efficiency, similar to the output stage, the efficiency of the complete amplifier can degrade substantially.

Figure 3:
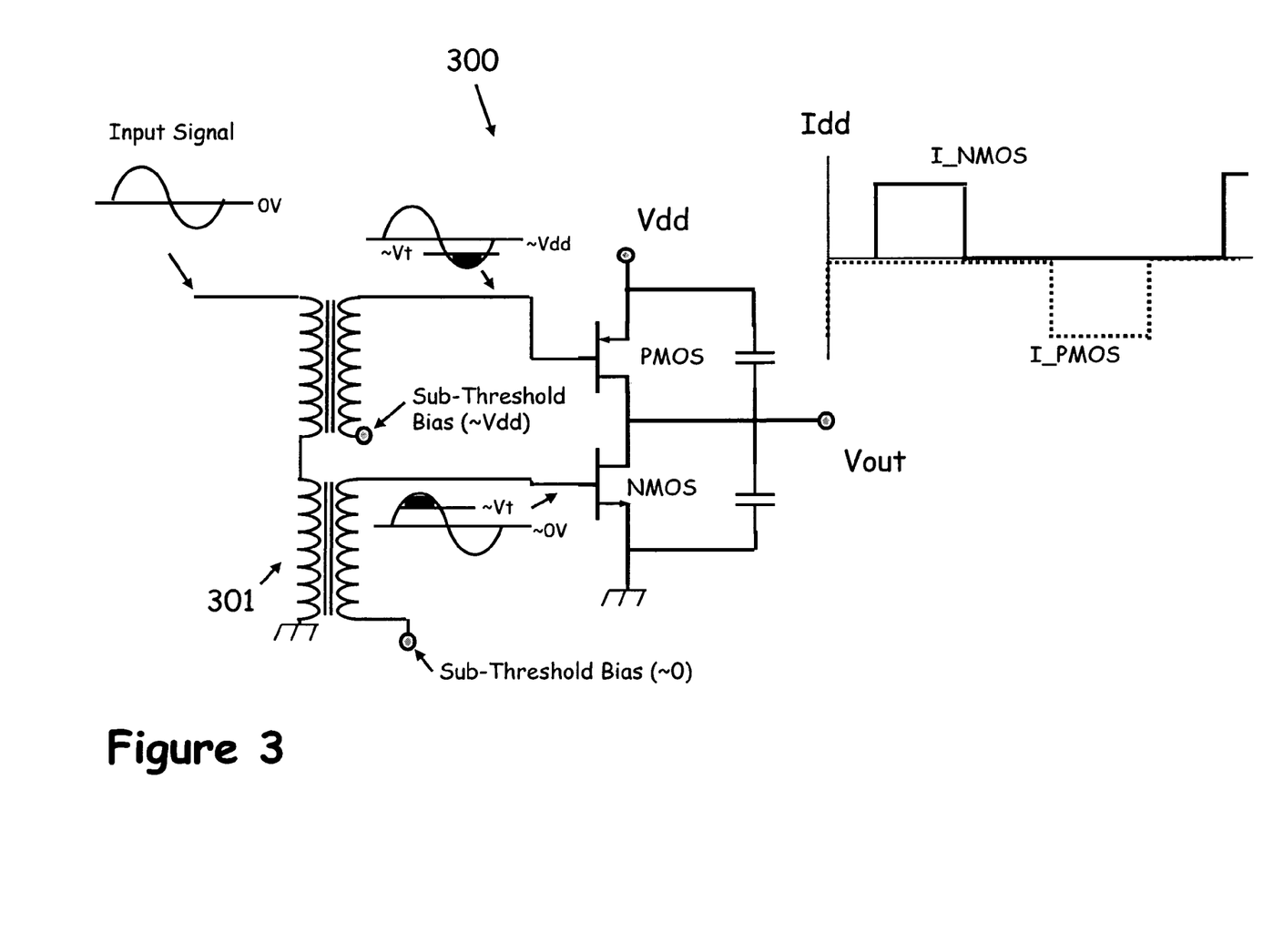
FIG. 3 shows a technique for generating the required drive signals for a class DE amplifier using a transformer.

Two techniques have been used in an effort to overcome these difficulties. A first technique is illustrated in FIG. 3, which shows circuit 300. FIG. 3 illustrates how a class DE amplifier can be configured to operate from a sine wave drive signal. Here, a transformer 301 is used to isolate the DC level for the two transistors of the push-pull stage. The transistors are then biased at or below threshold so that the amplifier has less than a 50% duty cycle. This solution may create several problems. In particular, the sub-threshold bias will further reduce the gain of the output stage devices. The resulting waveforms at the gates of the transistors may also exceed certain breakdown requirements for the devices, which will require the addition of diodes or other protection circuitry, further reducing gain and increasing complexity.

Figure 4:
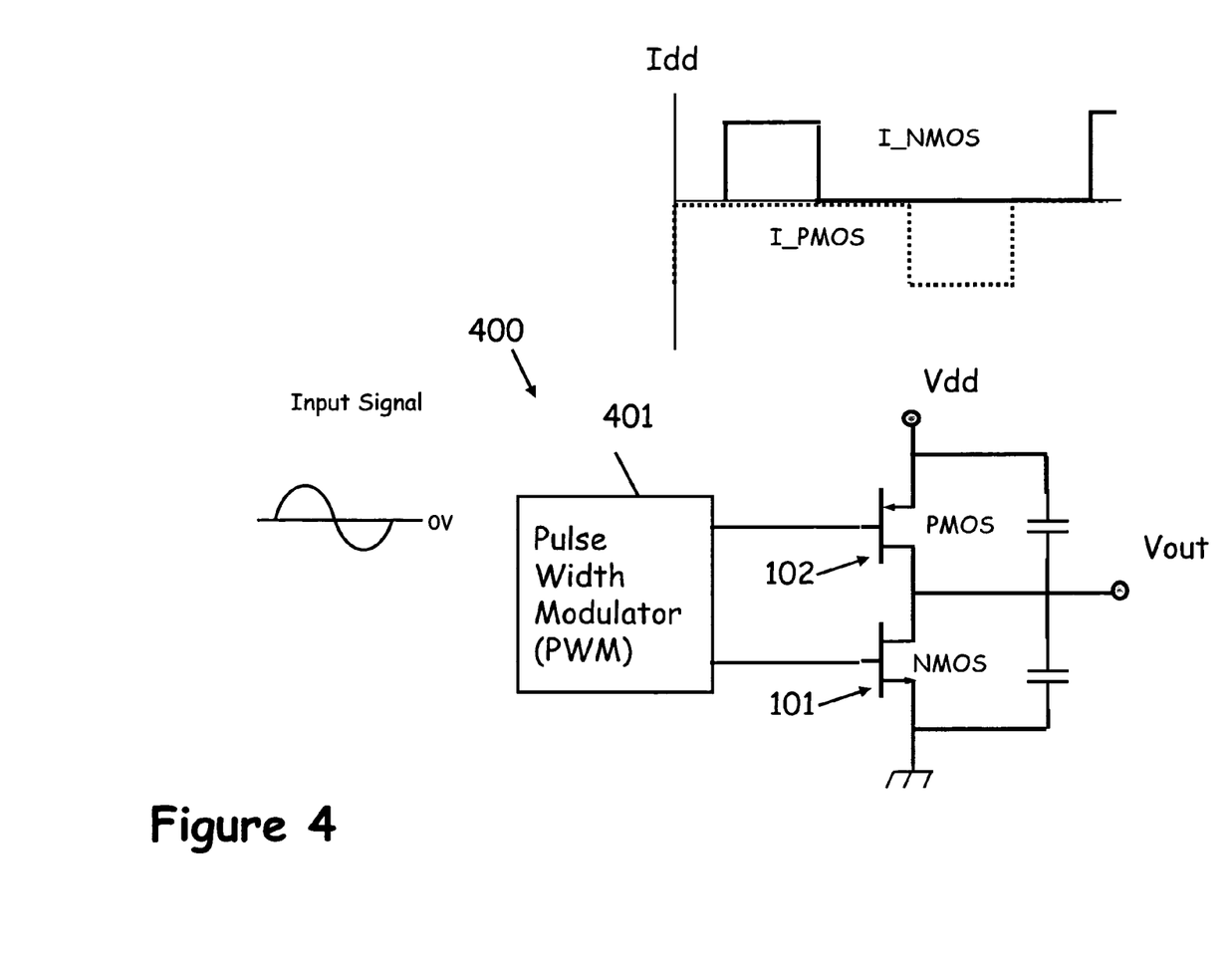
FIG. 4 shows another technique for generating drive signals for a class DE amplifier.

A second common technique, illustrated in FIG. 4 with respect to circuit 400, is to drive the output stage transistors independently with a pulse width modulator (PWM) circuit 401. A PWM circuit can provide flexibility, and can be capable of producing voltage waveforms of a suitable shape. However, PWM circuits are typically realized using low power digital circuit techniques that would not be able to deliver the power required to control the output transistors 101 and 102. Large buffer stages usually would be necessary, resulting in an unacceptable degradation in efficiency. As a result, this technique is not practical for RF applications and is typically only used at audio frequencies.

Figure 5:
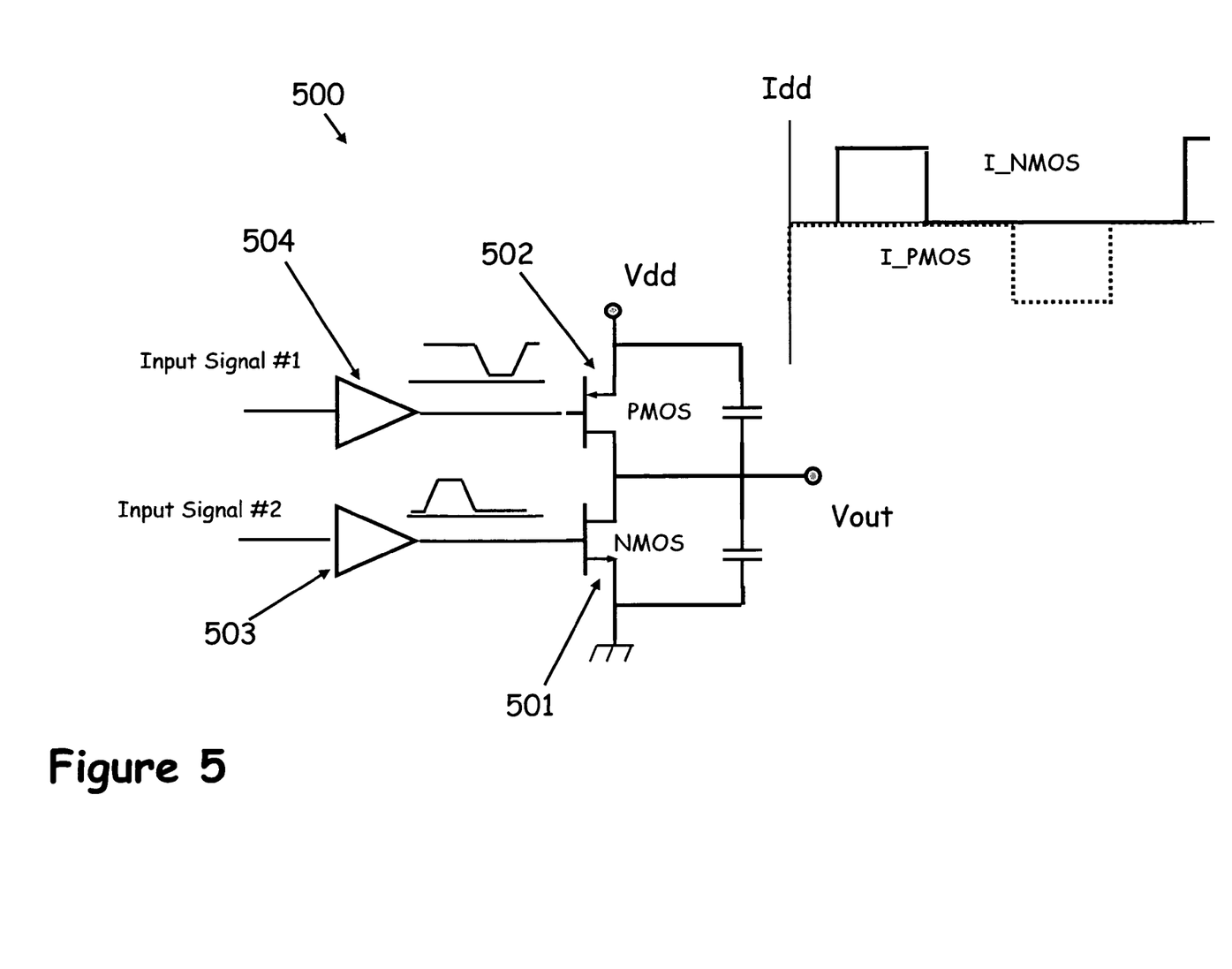
FIG. 5 shows tuned amplifier suitable for efficient operation at RF frequencies, in accordance with some embodiments of the invention.

FIG. 5 shows tuned amplifier 500, such as a tuned class DE amplifier, suitable for efficient operation at RF frequencies, in accordance with some embodiments of the invention. A solution to the problem described above may include splitting the amplifier (e.g., into two halves), and driving each transistor in the output stage with its own power driver circuit. Amplifier 503 may be designed to drive output transistor 501 with a pulsed waveform so as to achieve class DE operation of the output stage. Likewise, amplifier 504 may be designed to drive output transistor 502 with a pulsed waveform so as to achieve class DE operation of the output stage. Each driver amplifier advantageously can be capable of driving its output stage transistor 501 or 502 with a pulse characterized with a desired duty cycle, sharp transitions, and with high efficiency.

Figure 6:
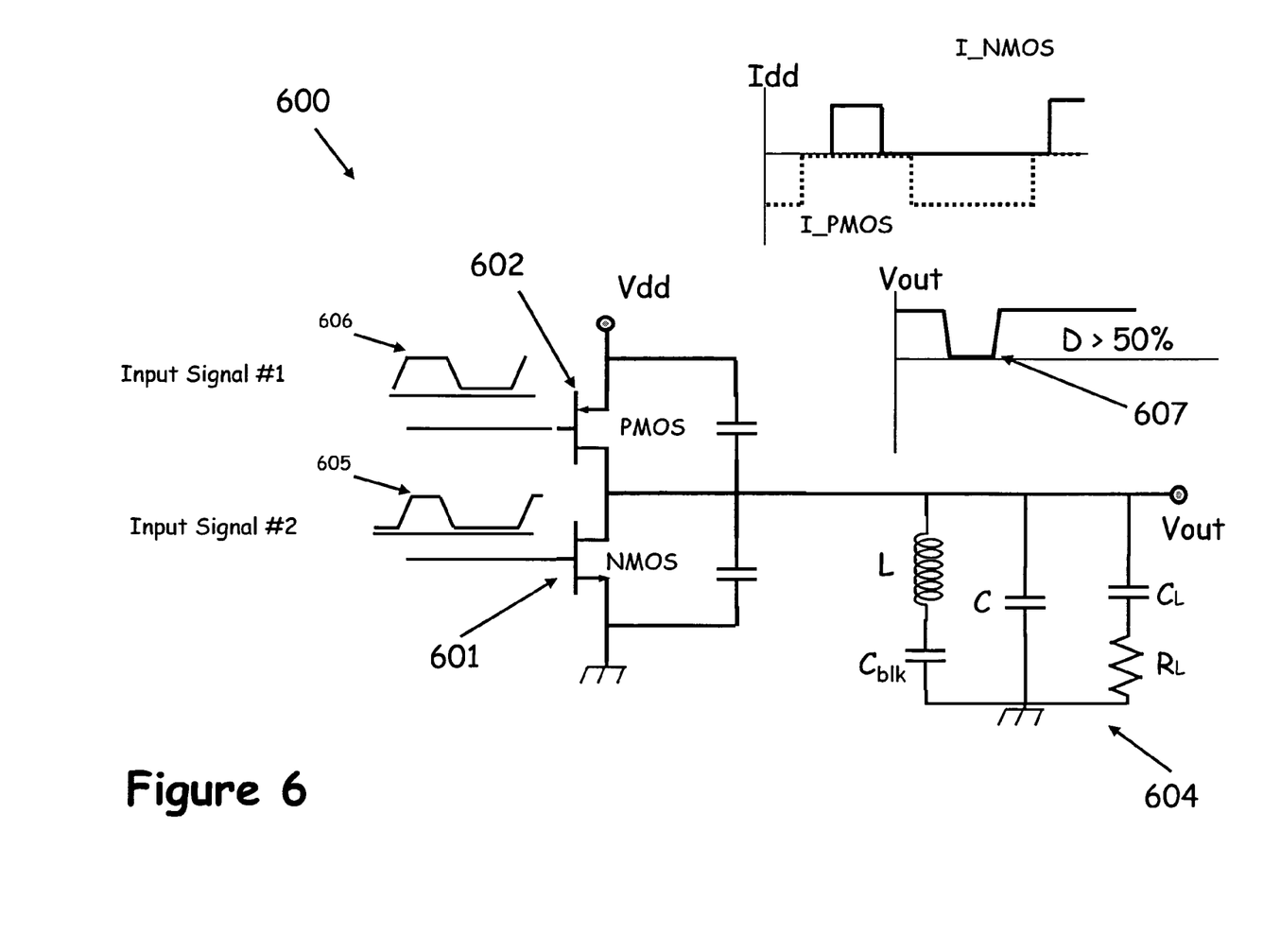
FIG. 6 shows a pulse amplifier stage capable of delivering a waveform with sharp transitions, variable duty cycle, and with high efficiency, in accordance with some embodiments of the invention

A U.S. patent application entitled "Pulse Amplifier," filed on even date herewith, describes a driver amplifier capable of delivering a waveform with sharp transitions, variable duty cycle, and with high efficiency. An example of such an amplifier is shown in FIG. 6. Amplifier 600 comprises a variation of the class DE amplifier and includes transistors 601 and 602 configured to work in a push-pull operation. Transistors 601 and 602 are driven by input signals 605 and 606 such that each transistor turns off before the other turns on, thereby creating sufficient time for the voltage across each device to return to zero before drawing current. Amplifier 600 differs from a standard class DE amplifier in that the output matching network 604 used to discharge the voltage across the output capacitance of the transistors 601 and 602 is realized using a shunt parallel resonant structure that leaves the output signal substantially unfiltered. The components of output matching network 604 may be selected such that the impedance of the output matching network at the switching frequency of transistors 601 and 602 is suitable for discharging the output capacitance of transistors 601 and 602 while providing an unfiltered output signal. The result can be an output waveform 607 that has sharp transitions, whereas a standard class DE amplifier (FIG. 1C) includes an output network that filters the output to produce a sinusoidal waveform.

Sharp transitions may include transitions that occur quickly compared to the switching period Tsw, which is the inverse of the switching frequency. For example, if the voltage at Vout transitions from zero to Vdd, the transition may occur in a small fraction of switching period, such as less than 5% of Tsw, less than 2% of Tsw, or less than 1% of Tsw. However, the transition time fraction of Tsw is only one metric for determining whether a transition is sharp, and it should be appreciated that sharp transitions may be characterized by different metrics. If transition time is used as such a metric, the transition time may be measured in any suitable way, such as the amount of time the signal takes to transition from 10% to 90% of the change in signal value, for example.

The transitions may be sharp enough that the waveform of pulsed signals appear to have a trapezoidal shape or the waveform of a square wave, when viewed on the time scale of about the switching period Tsw. Thus, waveforms having sharp transitions may comprise only straight edges, or straight rising and falling edges having angular transitions.

Amplifier 600 further differs from a standard class DE amplifier in that amplifier 600 can produce an output duty cycle other than 50%. As shown in FIG. 6, input signal 605 drives the NMOS "pull" transistor 602 and is chosen to have a duty cycle of greater than 50%, and input signal 606 drives the PMOS "push" transistor 603 and is chosen to have a duty cycle of less than 50%. The time when both transistors are in the OFF state, $\phi$, can remain the same as in a standard class DE amplifier. In the embodiments described herein, for a desired output duty cycle, the duty cycles of the input pulses to the pulse amplifier may be selected so as to maximize efficiency. For example, the total OFF time $\phi$ may be held constant while the duty cycles of the input signals are adjusted accordingly to maximize efficiency. The components in output matching network 604 can be chosen to properly discharge the output capacitance during the OFF time, $\phi$. Waveform 607 shows the resulting output voltage having less than a 50% duty cycle and characterized by sharp transitions. In some embodiments the output voltage may be produced with a desired duty cycle equal to or greater than 50% by decreasing the duty cycle of input signal 605 and increasing the duty cycle of input signal 606.

Figure 7:
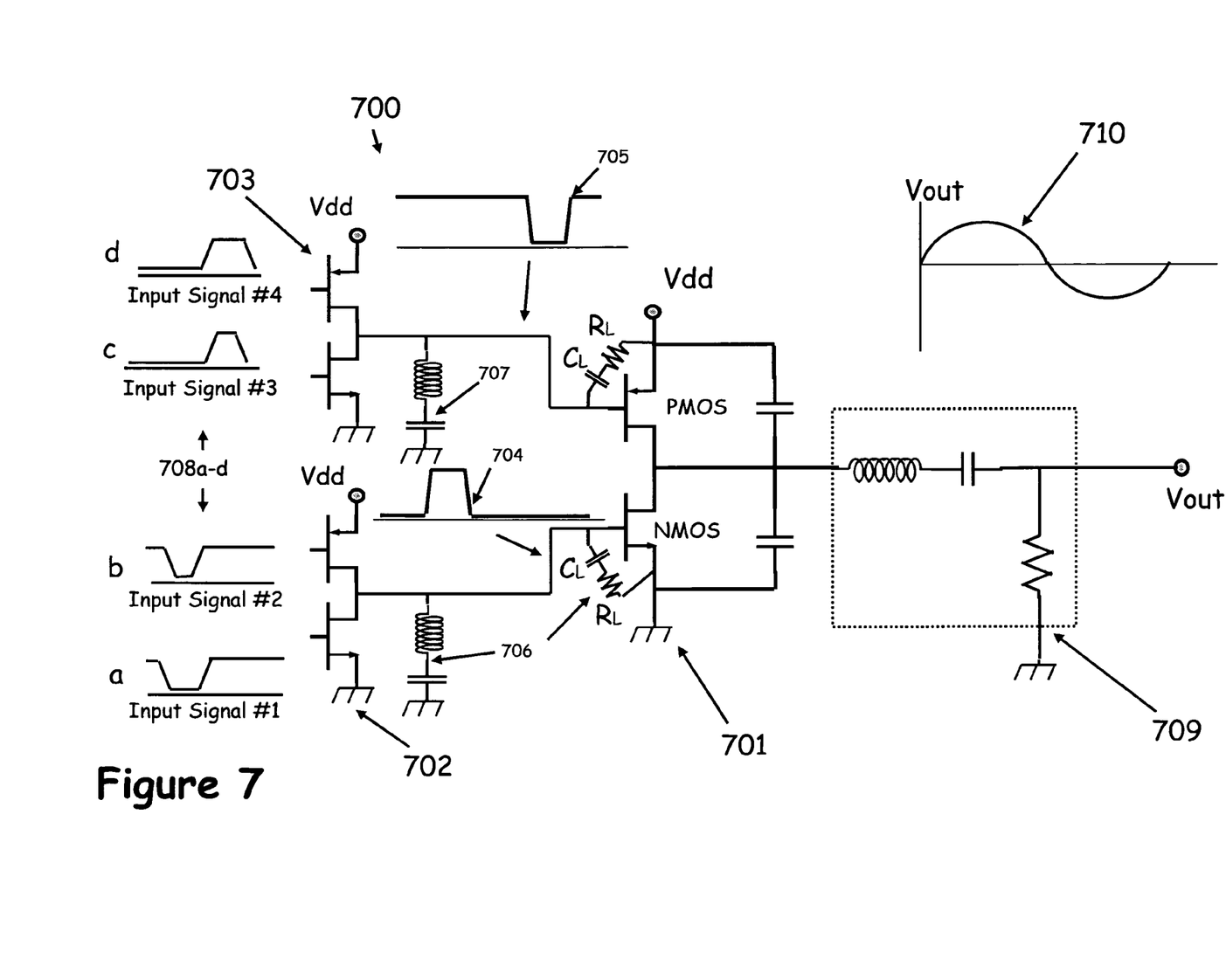
FIG. 7 shows a two-stage amplifier in accordance with an embodiment of the invention.

A multistage amplifier 700 in accordance with a exemplary embodiment of the invention is shown in FIG. 7. As shown, the multistage amplifier 700 is a two-stage amplifier comprising a class DE output stage, 701, and two driver amplifiers 702 and 703, which may be class DE pulse amplifiers. Each of the driver amplifiers is configured to drive one transistor in the class DE output stage 701. Each driver amplifier 702 and 703 has a load network, 706 and 707 respectively, that is formed by the intrinsic parasitic impedance (represented in FIG. 7 by capacitor CL in series with resistor RL) of the output transistor of the class DE output stage 701, and a shunt inductor in series with a bypass capacitor. Input waveforms 1-4, 708a-d, drive each transistor in the driver amplifiers, 702 and 703. Waveforms 708a and b can be chosen such that driver amplifier 702 will produce the voltage waveform 704 defined a duty cycle of less than 50%, with high efficiency. For example, the duty cycle of voltage waveform 704 may be the same as that of waveform 808b. Waveform 808a may be chosen to have a larger duty cycle than waveform 808b, so that an OFF time is provided during which neither of transistors in driver amplifier 802 is turned on. The OFF time may be chosen to be large enough so that load network 806 can discharge the capacitance of the transistors in driver amplifier 802, thus achieving zero voltage, zero slope and/or zero current switching, resulting in class DE or near class DE operation, and thus high efficiency for driver amplifier 802. Waveform 704 may be defined by sharp transitions as discussed above. Likewise, waveform 708c can be chosen such that driver amplifier 703 will produce the voltage waveform 705, defined by a duty cycle of greater than 50%, with high efficiency. Waveform 705 may be defined by sharp transitions as discussed above. As shown in FIG. 7, an output load network 709 is coupled to the output of class DE output stage 701 with components chosen to enable class DE operation and produce the filtered waveform 710. Each stage of multistage amplifier 700 can provide gain, output power, and do so with high efficiency. Multistage amplifier 700 can exhibit the high efficiency associated with a single stage class DE amplifier, but can provide a higher gain than a single stage class DE amplifier. As illustrated in FIG. 7, multistage amplifier 700 receives four input signals, instead of the two input signals used for a standard class DE amplifier. However, each of the four input signals 708a-d of multistage amplifier 700 may require a smaller amount of power and drive a smaller amount of input capacitance compared to the two input signals used for a standard class DE amplifier. As a result, the four input signals 708a-d of multistage amplifier 700 can be realized effectively with a PWM circuit. However, the input signals need not be generated using a PWM circuit, as other circuits may be used to generate the input signals.

Figure 8:
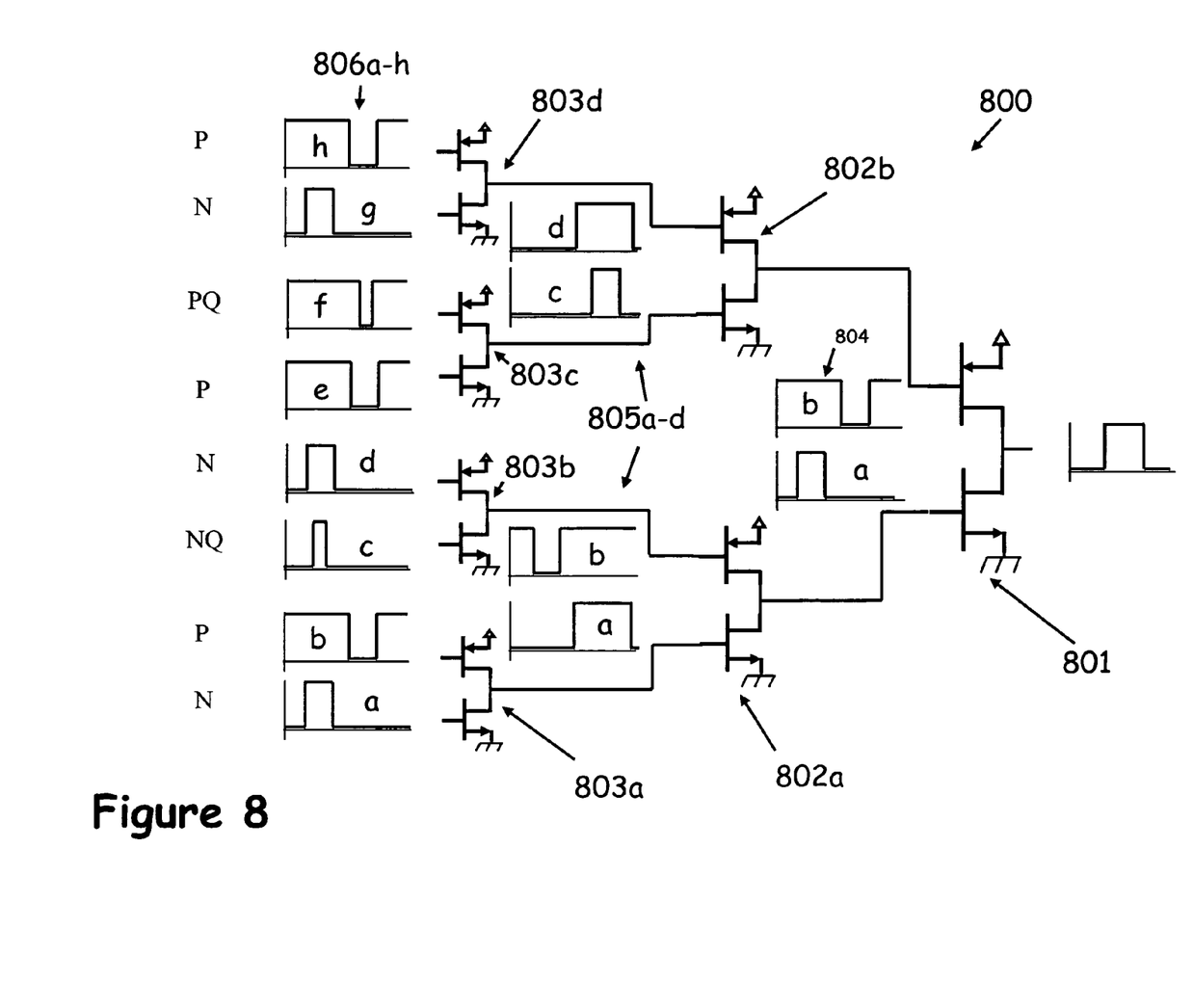
FIG. 8 shows a three-stage amplifier in accordance with an exemplary embodiment of the invention.

FIG. 8 illustrates how the multistage amplifier technique illustrated in FIG. 7 can be extended to include a third stage of driver amplifiers. FIG. 8 shows multistage amplifier 800, which is a three-stage amplifier in accordance with another embodiment of the invention. As illustrated in FIG. 8, four additional driver amplifiers 803a-d are provided to drive each transistor of driver amplifiers 802a-b. Multistage amplifier 800 receives eight input signals, 806a-h, which can be chosen so as to produce the drive signals 805a-d, respectively, to drive class DE output stage 801. Drive signals 806a-h can be chosen in a manner similar that discussed above with respect to waveforms 708a and 708b of FIG. 7, so as to enable the driver amplifiers 803a-d to generate pulses of a desired duty cycle with high efficiency. The result is multistage amplifier 800 can produce gain and output power with high efficiency in a manner similar to that of multistage amplifier 700, however multistage amplifier 800 may achieve an even higher gain than multistage amplifier 700 due to the additional stage. The input signals 806a-h can require a proportionately smaller amount of power and drive a proportionately smaller amount of load capacitance. This multistage amplifier technique can also be extended to produce a multi-stage distributed amplifier with a desired number of stages greater than three. The number of stages may be chosen based on the amount of gain desired. Although matching circuitry is not shown in FIG. 8 for clarity, any suitable matching circuitry may be used in accordance with the techniques described herein.

In another embodiment, the drive signals 806a-h can be chosen so as to reduce the total number of input signal waveforms that need to be generated. A reduction in the number of input signal waveforms can be achieved in many ways, including by duplicating signals, putting conditions on the input signals, or defining relationships between input signals. In an exemplary embodiment, the drive signals 805a and 805d are chosen to be square waves. Waveforms 805b and 805c may be chosen so as to ensure class DE operation as outlined above. First stage driver amplifiers 803a and 803d can receive identical drive signals, thereby reducing the total number of waveforms required by a factor of two. These waveforms can be designated as N, for signals 806a and g, and P for 806b and h. Waveforms N and P may be, for example, pulses with a duty cycle of 30%, positive going for driving an NMOS transistor, and inverted for driving a PMOS transistor. The first stage driver amplifier 803b can receive a sharp, positively-oriented pulse drive signal 806c for the NMOS transistor, and a wider positively-oriented pulse 806d for the PMOS transistor. The wide pulse 806d can be chosen to have a duty cycle equivalent to input signal N, but it may be advantageous if the sharp pulse is made sufficiently narrow so as to ensure high efficiency class DE operation and the desired output waveforms. Likewise, first stage driver amplifier 803c can receive a sharp negatively-oriented pulse 806f, and a wider negatively-oriented pulse 806e. The wide pulse can be made equivalent to input signal P, but it may be advantageous if the sharp pulse is made sufficiently fast so as to ensure high efficiency class DE amplification and the desired output waveforms. As shown in FIG. 8, the total number of waveforms has been reduced by a factor of two, and only four input waveforms may need to be generated (e.g., by a PWM circuit). Other waveform reduction techniques and substitutions can be employed, as the invention is not limited in this respect. Furthermore, these techniques can be extended to a multistage amplifier with a greater number of stages M. If each individual amplifier has two input terminals, the total number of input terminals in the first amplifier stage may be $2^M$. For example, FIG. 8 illustrates a multistage amplifier 800 in which M=3 and which has eight input terminals providing eight input signals to the first stage. Using waveform reduction techniques, the number of waveforms that need to be generated can be less than $2^M$. In the example discussed above with respect to FIG. 8, the total number of waveforms has been reduced by a factor of two, such that the number of input waveforms generated is $2^{M-1}$.

Figure 9:
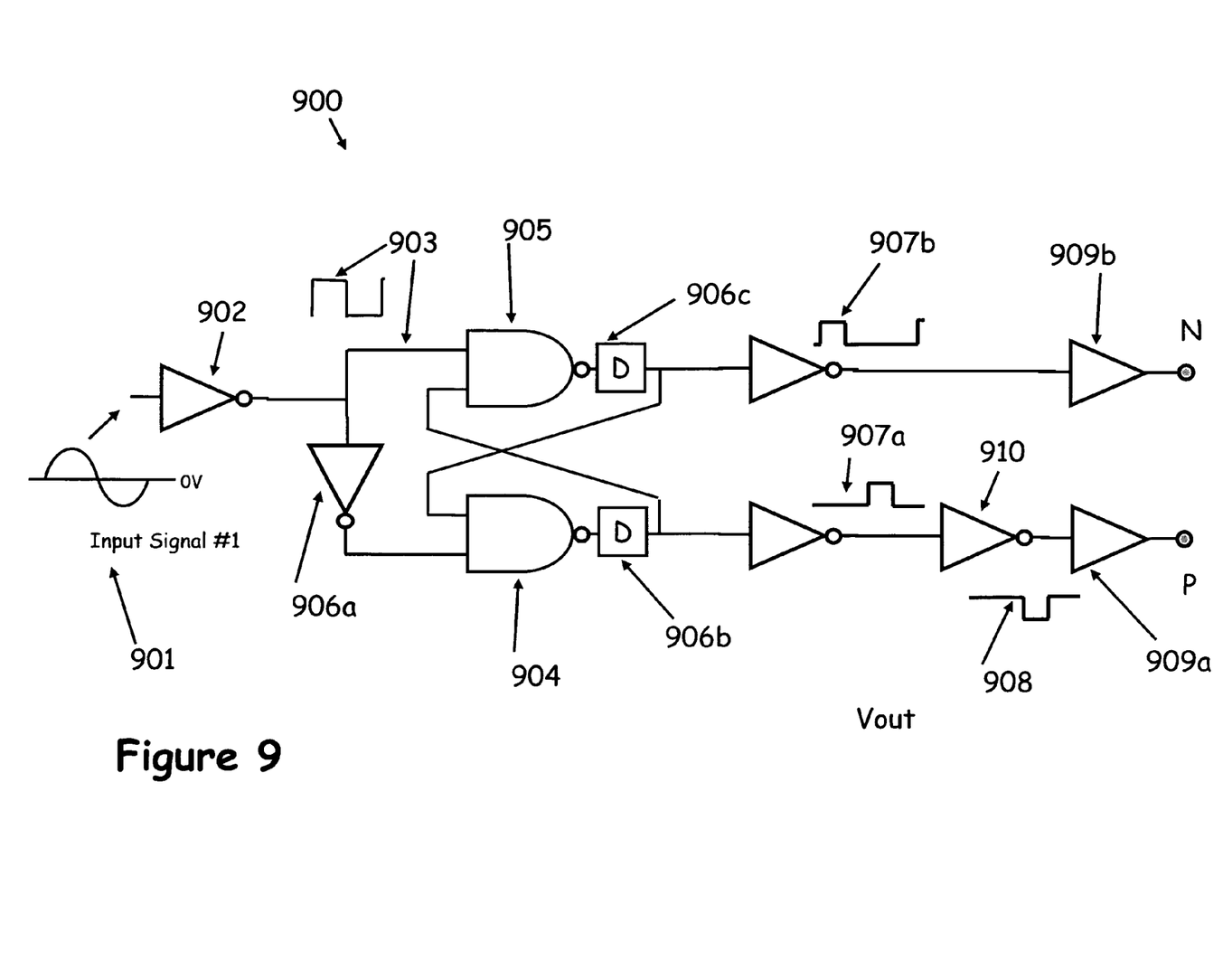
FIG. 9 shows a pulse generator circuit that may be used to produce drive signals for the multistage amplifiers of FIGS. 7 and 8.

The input waveforms provided to a multistage amplifier, such as waveforms 806a-h, can be generated using any suitable circuit technique, such as using circuit 900 shown in FIG. 9, according to one embodiment of the invention. Circuit 900 is commonly used to generate offset clock signals in digital circuits but can be tailored to generate a pulse whose width is defined by the delay element D 906. As shown in FIG. 9, the input signal 901 is passed through a high gain limiter, 902, producing a square wave signal 903. NAND gates 904 and 905, and delay elements 906a-c can act to compare the square wave signal to a delayed version of itself and produce pulses offset by 90°, shown as waveforms 907a and 907b. One or more of the output signals may be inverted by an inverter 910 so as to form a negatively-oriented pulse 908, which may be suitable for driving a PMOS device. Output buffers 909a and 909b may ensure proper signal levels and power capability for driving the first stage of a multistage amplifier (e.g., multistage amplifiers 700 and 800). Typically, at least two circuits 900 may be required to produce all of the signals for three-stage multistage amplifier 800. A first circuit 900 may generate waveforms N and P, and a second circuit 900 may generate the sharper signals NQ and PQ. Different sized buffers may be required depending on the number of first transistors to be driven. Additional buffers and/or inverters may also be necessary to drive a differential version of the distributed amplifier. However, it should be appreciated that the invention is not limited to the use of circuit 900 or a PWM circuit for producing input waveforms, as a variety of other suitable input waveform generation techniques may be used.

Figure 10:
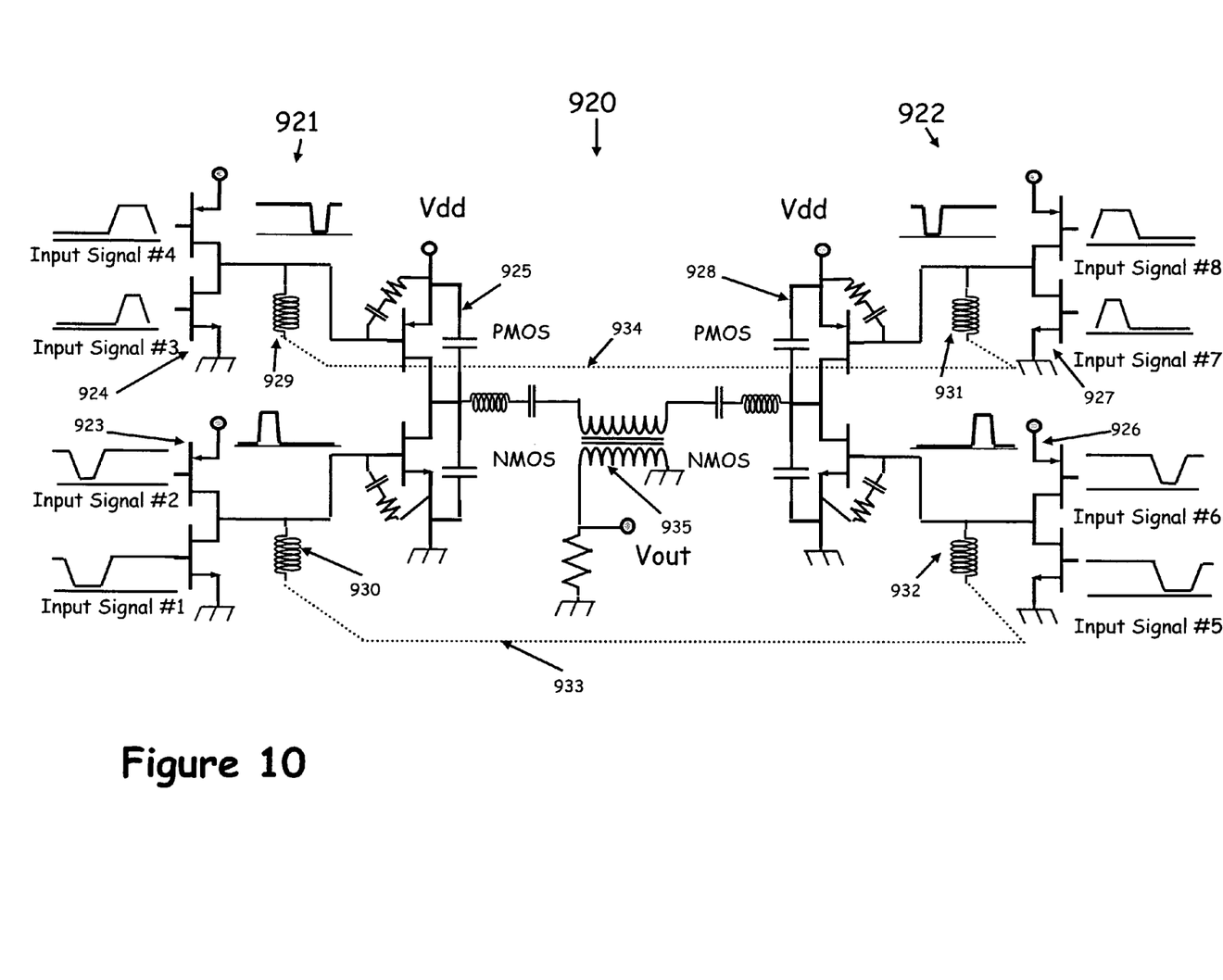
FIG. 10 shows a differential amplifier circuit, in accordance with some embodiments of the invention.

FIG. 10 shows a differential amplifier 920, according to some embodiments of the invention. Differential amplifier 920 addresses a problem that may arise as a result of the capacitance of the large blocking capacitors shown in series with the shunt inductors in load networks 706 and 707. The capacitance of these capacitors typically must be large enough so that the impedance of the capacitor is significantly less than that of the inductor, e.g., much greater than ten times less. However, such a capacitance may be inconsistent with semiconductor manufacturing processes. This difficulty can be overcome by implementing the full amplifier circuit in a differential manner. FIG. 10 shows differential amplifier 920 similar to the multistage amplifier circuit of FIG. 7, but which includes two halves driven 180° out of phase. As shown, the circuit 920 comprises a pair of two-stage class DE amplifiers 921 and 922. Amplifier 921 include two driver amplifier drivers 923 and 924, each with a separate load network 929 and 930, and class DE output stage 925. Amplifier 922 includes two driver amplifiers 926 and 927, each with separate load networks 931 and 932, and an class DE output stage 928. Input signals 1-4 can be chosen so as to drive driver amplifiers 923 and 924 consistent with the operation described in FIG. 7. Input signals 5-8 can be chosen so as to be identical to input signals 1-4 respectively, but phase shifted by 180°. This may result in operation identical to amplifier 921 and consistent with a previously described embodiment of the invention, but wherein the generated waveforms are 180° out of phase with the waveforms generated by amplifier 921. The output waveforms from amplifiers 921 and 922 are, as a result, 180° out of phase with each other and can be combined using a balun 935 to produce an output signal with twice the power of a single two-stage amplifier alone. In one aspect, load networks 929 and 931 can be coupled together via connection 934. Because driver amplifiers 924 and 927 operate 180° out of phase, connection 934 becomes a virtual ground. The bypass capacitors shown in the embodiments of FIG. 7 can thereby be eliminated. Likewise, load networks 930 and 932 can be coupled via connection 913, creating a virtual ground and eliminating further bypass capacitors.

Some of the techniques described herein relate to operating an amplifier in a class DE mode of operation. However, in some circumstances a sufficiently high efficiency can be achieved by operating a class D amplifier in a manner that is close to class DE operation but not "true" class DE operation. For example, a relatively small voltage and/or current may be present at the terminals of a transistor upon switching, but the resultant power loss may be acceptably small. Such techniques are within the scope of this disclosure.

Using the techniques described herein, an efficiency of greater than 70% may be achieved, however the invention is not limited in this respect, as the efficiency achieved may be higher or lower. In some implementations the efficiency may be at least 50%, while some implementations may achieve an efficiency of greater than 80% or 90%. As used herein, the term efficiency refers to the ratio of input power to output power.

For purposes of simplicity, the above description describes various techniques in the context of devices fabricated using a complementary metal-oxide-semiconductor (CMOS) process. However, it should be appreciated that the techniques described herein are not limited to CMOS, but a wide array of fabrication techniques can be employed, including Si bipolar and GaAs technology, as the invention is not limited in this respect. An amplifier in accordance with the present invention could be realized using bipolar technology, in which case the drive signals would have an associated current. Moreover, the amplifier does not require the use of complementary transistors as long as the drive signals are adjusted accordingly. Many other combinations and variations are possible.

As discussed above, the techniques of the present application and those described in a U.S. Patent Application filed on even date herewith entitled "Pulse Amplifier" may advantageously be used in combination with one another for providing efficient amplification. However, these techniques need not be used together and can be utilized individually, as the invention is not limited in this respect.

Having thus described several aspects of at least one embodiment of this invention, it is to be appreciated various alterations, modifications, and improvements may be made within the spirit and scope of the invention. Accordingly, the foregoing description and drawings are by way of example only.

What is claimed is:

1. A method of driving a push-pull amplifier, the push-pull amplifier comprising a push transistor and a pull transistor, the method comprising:
    driving the push transistor with a first pulsed RF signal; and
    driving the pull transistor with a second pulsed RF signal different from the first pulsed RF signal;
    wherein the first and second pulsed RF signals are pulsed microwave signals.

2. The method of claim 1, wherein the first and second pulsed RF signals are pulse-width-modulated RF signals.

3. The method of claim 1, wherein the first and second pulsed RF signals are substantially unfiltered.

4. The method of claim 1, further comprising:
    generating the first pulsed RF signal using a first tuned class D amplifier; and
    generating the second pulsed RF signal using a second tuned class D amplifier.

5. The method of claim 4, wherein the each of the first and second tuned class D amplifiers are tuned to operate in a class DE mode.

6. The method of claim 5, wherein the method is performed with an efficiency of at least 70%, wherein efficiency is a ratio of a total input power driving the push and pull transistors to an output power delivered at an output of the push-pull amplifier.

7. The method of claim 1, wherein each of the first and second pulsed signals comprises a square or trapezoidal waveform.

8. The method of claim 1, wherein the first pulsed RF signal has a first duty cycle that is different from a second duty cycle of the second pulsed RF signal.

9. The method of claim 8, wherein one of the first and second duty cycles is less than 50% and another one of the first and second duty cycles is greater than 50%.

10. The method of claim 1, wherein the push-pull amplifier differentially drives a load.

11. A circuit for amplifying a signal, the circuit comprising:
    a push-pull amplifier comprising a push transistor and a pull transistor;
    a first class D amplifier that drives the push transistor of the push-pull amplifier with a first RF signal; and
    a second class D amplifier that drives the pull transistor of the push-pull amplifier with a second RF signal different from the first RF signal;
    wherein the first and second RF signals are pulsed microwave signals.

12. The circuit of claim 11, wherein the first and second RF signals are first and second pulsed signals.

13. The circuit of claim 12, wherein each of the first and second pulsed signals comprises a square or trapezoidal waveform.

14. The circuit of claim 12, wherein the first pulsed signal has a first duty cycle that is different from a second duty cycle of the second pulsed signal.

15. The circuit of claim 11, wherein the push-pull amplifier is a first push-pull amplifier, and wherein the first class D amplifier comprises a second push-pull amplifier and the second tuned class D amplifier comprises a third push-pull amplifier.

16. The circuit of claim 15, wherein the first, second and third push-pull amplifiers are each tuned to operate in a class DE mode.

17. The circuit of claim 11, wherein the circuit has an efficiency of at least 70%, wherein the efficiency is a ratio of input power to output power.

18. The circuit of claim 11, wherein the first and second RF signals are substantially unfiltered.

19. The circuit of claim 11, further comprising:
    a second push-pull amplifier comprising a push transistor and a pull transistor;
    a third class D amplifier that drives the push transistor of the second push-pull amplifier with a third RF signal; and
    a fourth class D amplifier that drives the pull transistor of the second push-pull amplifier with a fourth RF signal different from the third RF signal.

wherein the push-pull amplifier is a first push-pull amplifier;

wherein the first push-pull amplifier and the first and second class D amplifiers are configured as a first portion of a differential amplifier;

wherein the second push-pull amplifier and the third and fourth class D amplifiers are configured as a second portion of the differential amplifier.

20. The circuit of claim 19, wherein the first and second portions of the differential amplifier are coupled to a balun to differentially drive a load.

21. The circuit of claim 20, further comprising a shunt inductor coupled to an output of the first class D amplifier and to a terminal that is grounded during operation of the circuit.

22. The circuit of claim 19, further comprising:
   a first shunt inductor coupled to an output of the first class D amplifier;
   a second shunt inductor coupled to an output of the second class D amplifier;
   a third shunt inductor coupled to an output of the third class D amplifier; and
   a fourth shunt inductor coupled to an output of the fourth class D amplifier;
   wherein the first shunt inductor is coupled to the third shunt inductor;
   wherein the first and third class D amplifiers are driven such their outputs are approximately 180° phase-shifted with respect to one another and the first and third shunt inductors are coupled together at a virtual ground node;
   wherein the second shunt inductor is coupled to the fourth shunt inductor;
   wherein the second and fourth class D amplifiers are driven such that their outputs are approximately 180° phase-shifted with respect to one another and the second and fourth shunt inductors are coupled together at a virtual ground node.

* * * * *